United States Patent [19]

Long et al.

[11] Patent Number: 5,713,791
[45] Date of Patent: Feb. 3, 1998

[54] MODULAR CLEANROOM CONDUIT AND METHOD FOR ITS USE

[75] Inventors: Curtis C. Long; Michael L. Pape, both of Austin, Tex.

[73] Assignee: Motorola, Inc., Schaumburg, Ill.

[21] Appl. No.: 417,536

[22] Filed: Apr. 6, 1995

[51] Int. Cl.[6] .................................................. F24F 3/16
[52] U.S. Cl. .......................... 454/187; 55/385.2; 55/473
[58] Field of Search ........................ 454/187; 55/385.2, 55/470, 473

[56] References Cited

U.S. PATENT DOCUMENTS

| | | | |
|---|---|---|---|
| 3,782,265 | 1/1974 | Pielkenrood et al. | 55/473 X |
| 4,660,464 | 4/1987 | Tanaka | 55/385.2 X |
| 4,682,927 | 7/1987 | Southworth et al. | 414/217 |
| 4,917,004 | 4/1990 | Okamoto et al. | |
| 4,963,069 | 10/1990 | Wurst et al. | 454/187 X |
| 5,279,632 | 1/1994 | Decker et al. | 55/355 |
| 5,326,316 | 7/1994 | Hashimoto et al. | 454/187 |

FOREIGN PATENT DOCUMENTS

| | | | |
|---|---|---|---|
| 2 546 328 | 11/1984 | France. | |
| 62-87749 | 4/1987 | Japan | 454/187 |
| 1-6636 | 1/1989 | Japan | 454/187 |
| WO94/11679 | 5/1994 | WIPO. | |

*Primary Examiner*—Harold Joyce

[57] ABSTRACT

A cleanroom conduit (44) is used for transporting products between two cleanroom environments through an area that is less clean than either cleanroom environments. The conduit is modular in nature and thus can be adapted for various distances between the two cleanrooms. Each modular section (10 & 30) has a perforated floor (12) for exhausting gas and contaminants out of the modular section. Additionally, each modular section (30) has a filter (38) attached to a wall, with an opening therein, for filtering the incoming gas that is being supplied recirculated through the conduit. In effect, the conduit is maintained as a mini-cleanroom such that products being moved from the first cleanroom through the conduit do not require a decontamination step before they can be reintroduced into the second cleanroom.

21 Claims, 5 Drawing Sheets

MODULAR CLEANROOM CONDUIT AND METHOD FOR ITS USE

FIELD OF THE INVENTION

The present invention relates generally to a facilities structure, and more particularly to a conveyance structure for transporting product between cleanrooms.

BACKGROUND OF THE INVENTION

In the semiconductor industry, products are manufactured in a cleanroom environment because they are very sensitive to contaminants and particulates in the ambient environment. To provide protection to the semiconductor wafers while they are being processed, contaminants and sources of contaminant materials are rigorously eliminated. Generally, cleanrooms rely on continual filtration of the air for removal of any contaminant material which may be present or introduced. In this regard, the biggest source of particulates in cleanrooms originates from humans, e.g. skin flakes, hair, dust on clothing, sneezing, etc. Additionally, contaminants may actually be produced in the cleanroom during the manufacturing process involving the working or removal of materials from workpieces or condensing or coalescing from vapors. Therefore, it is imperative that all air within the cleanroom be continually recirculated and filtered. It is similarly important that contaminants, when produced, be quickly transported to locations where they can be captured and thus restrained from circulating to other areas of the cleanroom. For this purpose, air is usually circulated through the cleanroom from the ceiling to the floor and then returned through ducts to the ceiling. This provides circulation across the shortest dimension of the room and effectively confines contaminants to the area where they are produced. Also, since contaminants are typically denser than the atmosphere, the rapid transportation of contaminants is aided by gravity.

The products must undergo numerous wafer fabrication processes, such as deposition, etch, polishing, etc., before the finished devices are formed on the silicon wafers. Often, the equipment for the various processes are physically located in different cleanrooms in the manufacturing facility. Thus, it is necessary to transport products between clean environments, which means that the wafers must be taken out of the first cleanroom and physically transported to the second cleanroom. However, once the wafers are removed from the first cleanroom but before they can be taken into the second cleanroom for the next process step, the wafers must be decontaminated to remove any particulates they might have picked up during the transport process. This is done to prevent the introduction of contaminants into the second cleanroom and to eliminate residual build-up of particles on the products. Wash stations and appropriate equipment for decontamination must be put in place to do the cleaning which has obvious disadvantages.

One such disadvantage is that the equipment requires capital investment and valuable floor space. The floor space must also be in a cleanroom environment and be connected somehow to the cleanroom where the process equipment is located. Additionally, by requiring a manual decontamination step every time the wafers are transported between cleanrooms, the overall cycle time for the manufacturing of the wafers is increased in a non-value-added step.

Thus, a need exists for a mechanism to transport products between two separate cleanroom environments that would eliminate the requirement of a decontamination station for the products before they can be reintroduced into the second cleanroom environment.

DETAILED DESCRIPTION OF A PREFERRED EMBODIMENT

The invention generally provides a cleanroom conduit for transporting products between two cleanroom environments through an area that is less clean than either cleanroom environments. The conduit is modular in nature and thus can be adapted for various distances between the two cleanrooms. Each modular section has a perforated floor/bottom for exhausting air and contaminants out of the modular section. Additionally, some of the modular sections have a filter attached to a wall for filtering incoming air that is being circulated through the conduit. In effect, the conduit is maintained as a mini-cleanroom such that products being moved from the first cleanroom through the conduit do not require a decontamination step before they can be reintroduced into the second cleanroom.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
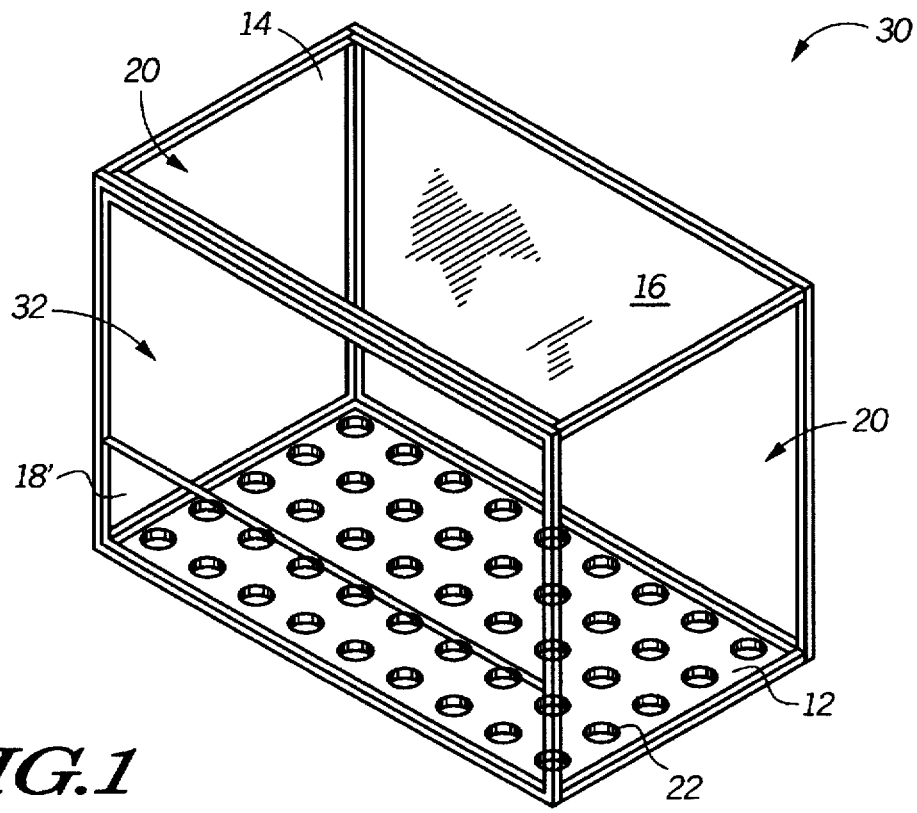
FIG. 1 illustrates, in a perspective view, a first modular section, having an opening in one of the outer walls, for a cleanroom conduit in accordance with the present invention.

FIG. 1 illustrates, in a perspective view, a conduit modular section 30 in accordance with the present invention. As illustrated, the conduit modular section 30 is a rectangular tube with four walls 12, 14, 16 & 18' and two open ends 20, creating a chamber. Each wall is constructed with a transparent material for easy viewing into the chamber. Examples of suitable materials include a rigid polycarbonate, such as Lexan™, and glass. Using a polycarbonate for the sidewalls has an advantage of making the modular section lightweight. Although not specifically illustrated, one or more of the walls may include doors for easy access into the chamber. The frame of each modular section may be constructed from, but is in no way limited to, aluminum, painted steel, or polished stainless steel. Additionally, the modular section 30 has in one of its walls 18', other than the bottom wall 12, an opening 32 for supplying a gas into the chamber. The gas is preferably air but can be any other inert gas desired, such as nitrogen for maintaining a dry environment.

When multiple modular sections are connected together, they form a passageway or conduit for products to pass through. The bottom wall 12 is perforated so that air and contaminants can be exhausted out of the chamber. Having the perforations 22 on the bottom wall 12 of the conduit modular section 30 is desired because it allows gravity to aid the air circulating process as well as the removal of contaminants from the chamber because as noted previously, contaminants tend to be heavier than air and thus settle to the bottom easily. The percentage of perforation or number of holes 22 needed is dependent upon how the entire modular cleanroom conduit is designed. Basically, the design requires that a positive pressure be created inside the chamber as compared to ambient pressure to help exhaust the contaminants/ particles out the perforated wall. In this manner, filtered air can be circulated or recirculated through the module.

Figure 2:
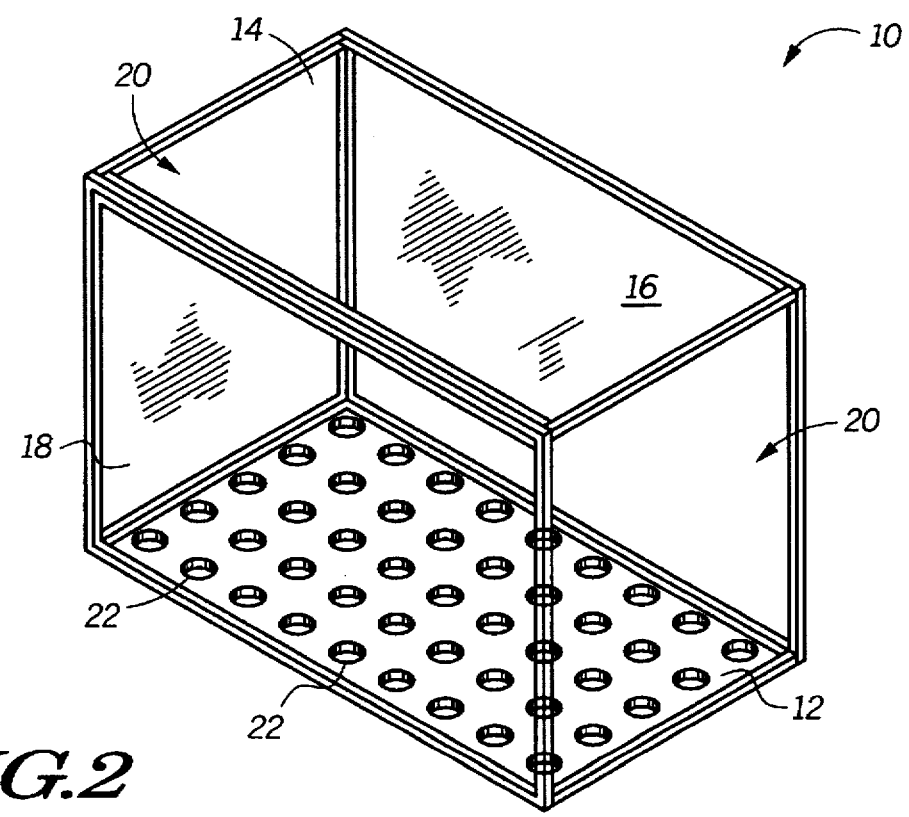
FIG. 2 illustrates, in a perspective view, a second modular section for a cleanroom conduit in accordance with the present invention.

FIG. 2 illustrates, in a perspective view, another conduit modular section 10 in accordance with the invention. Conduit modular section 10 also has four walls 12, 14, 16 & 18 and two open ends 20, like the conduit module 30 of FIG. 1. However, the conduit modular section 10 does not have an opening in one of its walls for a gas to be supplied therethrough into its chamber. It is intended that the gas will be supplied through the two open ends 20 when this modular section 10 is attached to a modular section 30 of FIG. 1.

Figure 3:
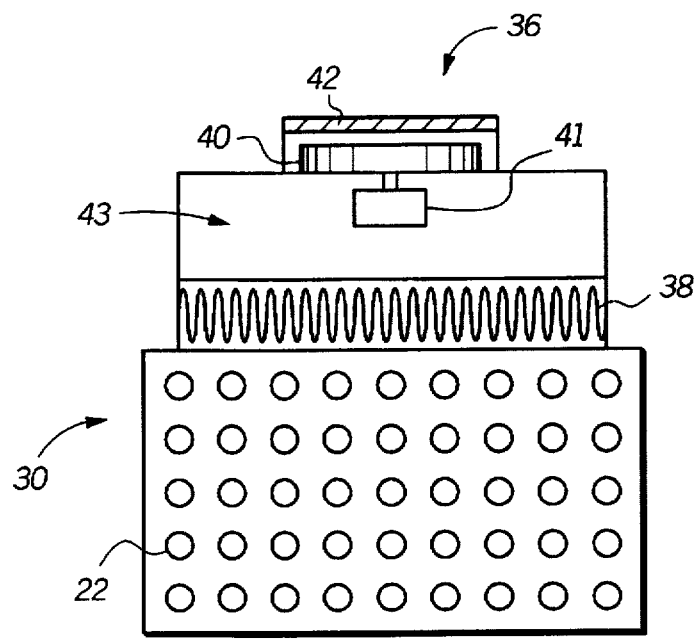
FIG. 3 illustrates, in a top view, incoming gas and filtering means for attachment to the opening in the outer wall of the first modular section of FIG. 1.

FIG. 3 illustrates, in a top view, the conduit modular section 30 of FIG. 1 having a fan and filter assembly 36 for supplying gas into the chamber of the modular section. The fan and filter assembly 36 is attached to the module at the opening 32 (shown in FIG. 1). Air or another inert gas can be supplied into the chamber through the opening by way of a fan 40 placed near the opening to draw the gas into the chamber. The fan 40 is typically a centrifugal type driven by a motor 41. Additionally, a filter 38 is placed between the fan 40 and the opening to filter out contaminants and particulates in the incoming gas so that what is supplied to the chamber is as free of contaminants as possible. The level of impurity in the supplied gas into the chamber is a function of the filter used. For example, a high efficiency particulate air (HEPA) filter is rated by the American Society of Heating, Refrigeration and Air Conditioning Engineers (ASHRAE) as 99.99% efficient at 0.3 µm particulates, while an ultra low particulate air (ULPA) filter is rated at 99.9995% efficiency at 0.12 µm. For a cleanroom environment having less than 1 particle per cubic foot (0.0283 m$^3$) at 0.5 µm, the use of an ULPA filter is preferred. A pre-filter 42 may be optionally attached to the intake side of the fan 40 to help reduce the level of particulates in the incoming gas before it is passed through the filter 38 located at the opening in the module. Providing such a fan and filter assembly 36 is within the skill of one of ordinary skill in this art. It is only necessary to make sure that the size of the fan and filter assembly fits the opening in the cleanroom conduit and can be bracketed, or otherwise attached, thereto. Ideally, the fan and filter assembly should be positioned on the top wall directly opposite the bottom perforated wall to more closely simulate a typical cleanroom. However, due to space constraint in the ceiling, as this structure will most probably be mounted overhead, there may not be room to place the filter on the top wall of the conduit module. Therefore, a sidewall is used instead. It has been confirmed in a reduction to practice, that the placement of the filter on a sidewall is effective to recirculate the air and maintain a cleanroom environment within the conduit.

Figure 4:
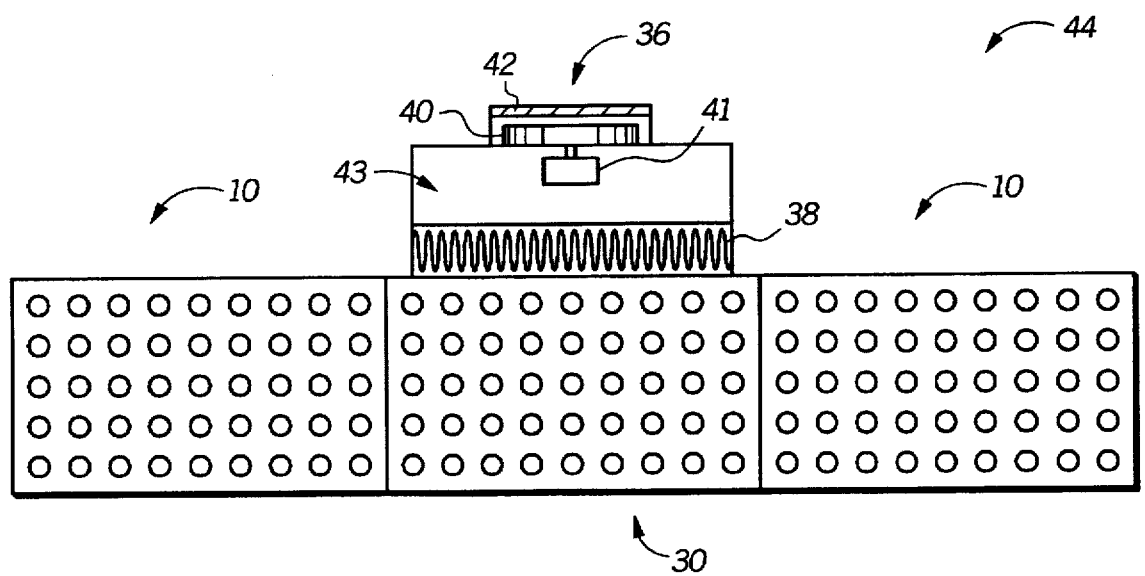
FIG. 4 illustrates, in a top view, a portion of a modular cleanroom conduit, comprising both first and second modular sections, in accordance with an embodiment of the invention.

FIG. 4 illustrates, in a top view, a portion of a modular cleanroom conduit 44, having several modular sections connected together to form the cleanroom conduit for transporting product in accordance with an embodiment of the present invention. As can be seen, it is not necessary to provide a modular section having a filter and fan assembly attached thereto for each section of the cleanroom conduit. Instead, one or several modules 10 (of FIG. 2) may be attached adjacent to each other and only one module 30 (FIG. 1) need be interspersed between the modular sections 10 to supply incoming air, or another gas, to the conduit. In this manner, the cleanroom conduit can be designed to accommodate the length of any region between two cleanrooms since the conduit is built from modular sections.

The incoming gas is supplied through the fan and filter attached to the opening in the conduit modular section 30 (hereinafter the "first" modular section). The rate at which the incoming gas is supplied should provide at least 10 changes per minute of filtered gas to each first modular section 30. The supplied gas then flows from the first modular section 30 to the conduit modular section 10 (hereinafter the "second" modular section). In the embodiment shown wherein there would be a 1:1 ratio of second to first modular sections along the length of the cleanroom conduit, the percentage of perforations needed is approximately 50% or less to create the necessary positive pressure inside the conduit to maintain a continuous air flow through the chambers of the conduit. As the ratio of the number of second modular sections 10 (having no filter) to first modular sections 30 (having a filter) increases, the percentage of perforations (open area) decreases. For example, a ratio of second modular sections 10 to first modular sections 30 of 3:1 would require a 25% perforated wall (25% open area) or less to create the positive internal pressure, while the same ratio of 2:1 would require a 33% or less open area perforated wall. For a cleanroom environment requirement having less than 1 particle per cubic foot (0.0283 m$^3$) at 0.5 µm, a maximum ratio of 4:1 of second modular sections 10 to first modular sections 30 is recommended. However, if the allowable level of impurity can be higher, then more modular sections having no filter may be attached to a lesser number of modular sections having filters attached to the outer wall. It is expected that a ratio of 10:1 of second modular sections to first modular sections may be sufficient to maintain an acceptable cleanroom environment for many applications. It should be noted that one significant difference between the air flow in the cleanroom conduit and the air flow in a large cleanroom environment is that the flow within the conduit is turbulent flow whereas the flow in an actual cleanroom is laminar.

Figure 5:
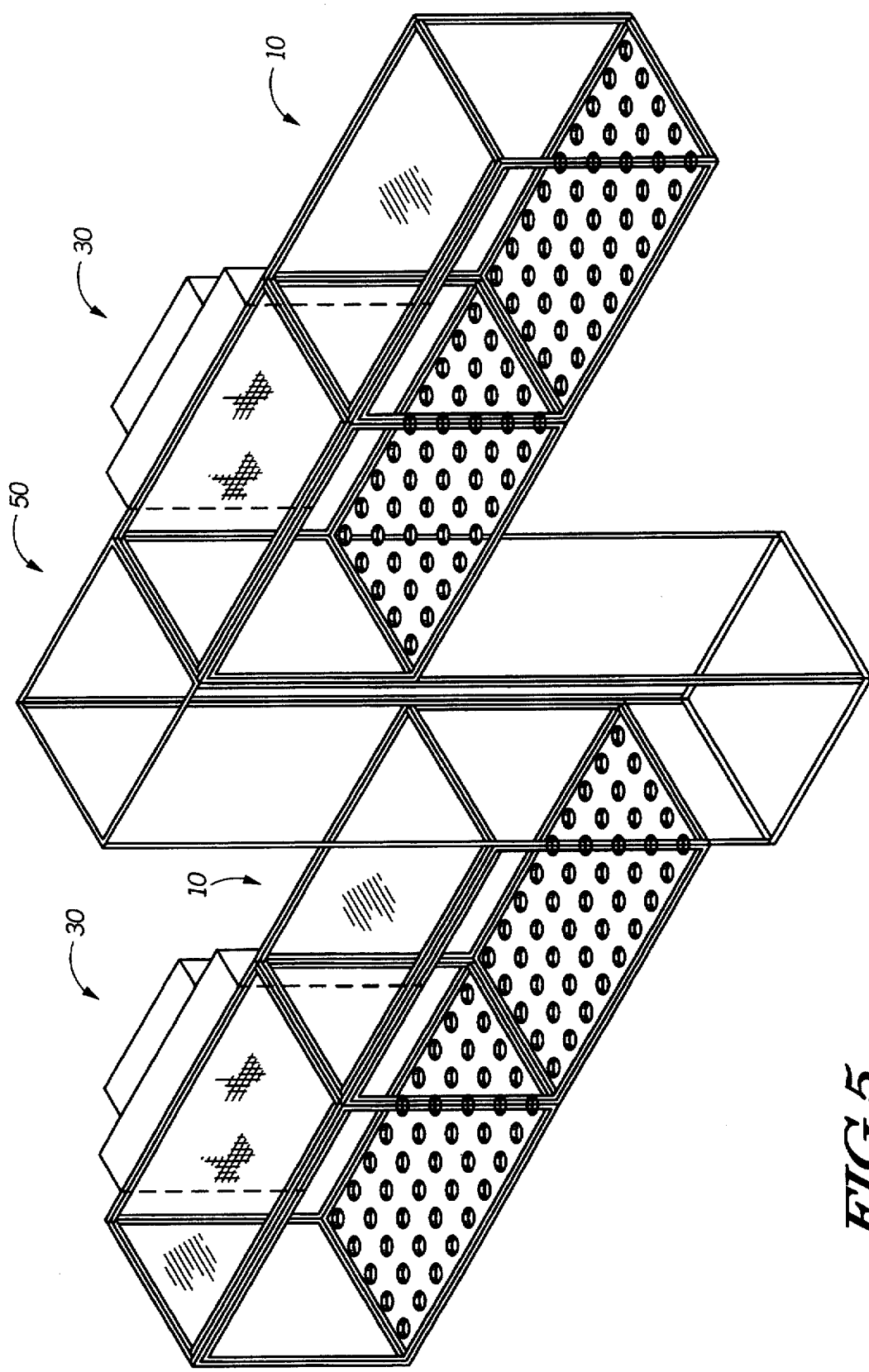
FIG. 5 illustrates, in a perspective view, two sections of a modular cleanroom conduit having an enclosed vertical transfer station connecting the two sections to allow a change in elevation of the cleanroom conduit.
Figure 6:
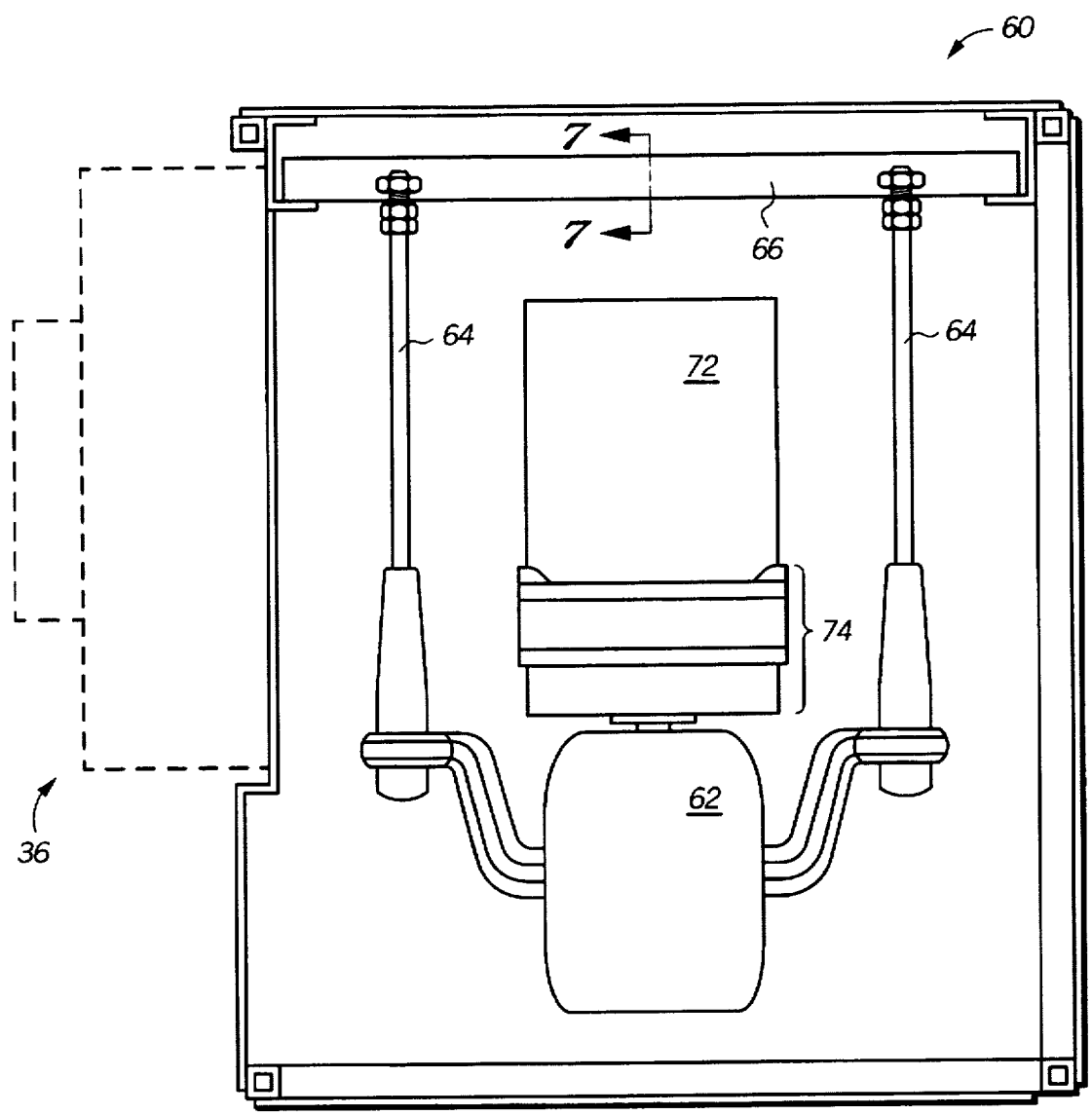
FIG. 6 illustrates, in a cross-sectional view, the cleanroom conduit having a track for transporting product mounted therein in accordance with the invention.
Figure 7:
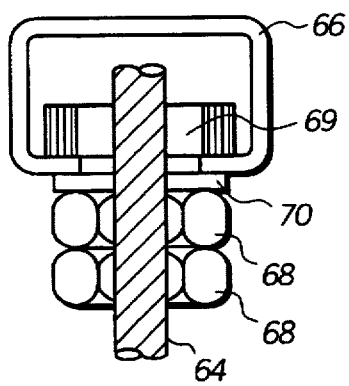
FIG. 7 illustrates, in a cross-sectional view along lines 7—7 in FIG. 6, the mounting bracket for the track.

FIG. 5 illustrates, in a perspective view, two sections of a modular cleanroom conduit having an enclosed vertical transfer station 50 connecting the two sections to allow a change in elevation of the cleanroom conduit. As illustrated, one section of the cleanroom conduit is at a higher elevation than the other. The vertical transfer station 50, simplistically represented for ease of illustration, is especially advantageous for transporting products from one floor to another floor in the manufacturing facility. The vertical transfer station is also maintained at the same cleanroom purity level as the cleanroom conduit so that there is no contamination associated with the products' movement from one section of the conduit to the other section. An additional advantage to having the vertical transfer station connecting the two sections is that it can also serve as a staging area. The product movement can be staged or scheduled with a built-in waiting area to facilitate the smooth flow of product within the cleanroom conduit since the flow movement is bi-directional. FIG. 6 illustrates, in an end view, a cleanroom conduit 60 having a conveyance track 62 mounted therein for transporting product through the length of the conduit. The conveyance track 62 may a conventional track that is commonly used in the semiconductor industry for moving semiconductor wafers. One such example of an available track is made by Daifuku. The track is suspended by hanger rods 64 from the ceiling of the conduit on a bracket 66 built into each conduit module. FIG. 7 illustrates a cross-sectional view of the mounting mechanism provided by the invention along line 7—7 of FIG. 6. The bracket 66 used in the reduction to practice is a Unistrut™, preferably of stainless steel construction. The hanger rods 64 are mounted to the Unistrut™ 66 with nuts 68 & 69 and a washer 70. The upper nut 69 is a special nut known in the art as a Unistrut™ nut. The lower nuts 68 are standard stainless steel lock nuts. The hanger rods 64 are threaded and are thus secured by the nuts 68. These hanger rods 64 are a part of the track design and are standard equipment for the manufacturer.

One reason why the Daifuku track was chosen as the preferred track was that it does not generate much particulate from its operation since it uses all sealed bearings. Additionally, the track system has a small muffin fan every 2 m to draw air into the track which pulls any particles/contaminants generated by the track's operation down to the bottom of the cleanroom conduit. The contaminants are then expelled from the chamber through the perforated bottom. Referring back to FIG. 6, a product carrier 72, typically a wafer boat for carrying semiconductor substrates, is placed on a car assembly 74 for the track 62. The car assembly 74 is guided along the track 62 to transport product from one point to another; for example, from a first cleanroom to a second cleanroom.

Figure 8:
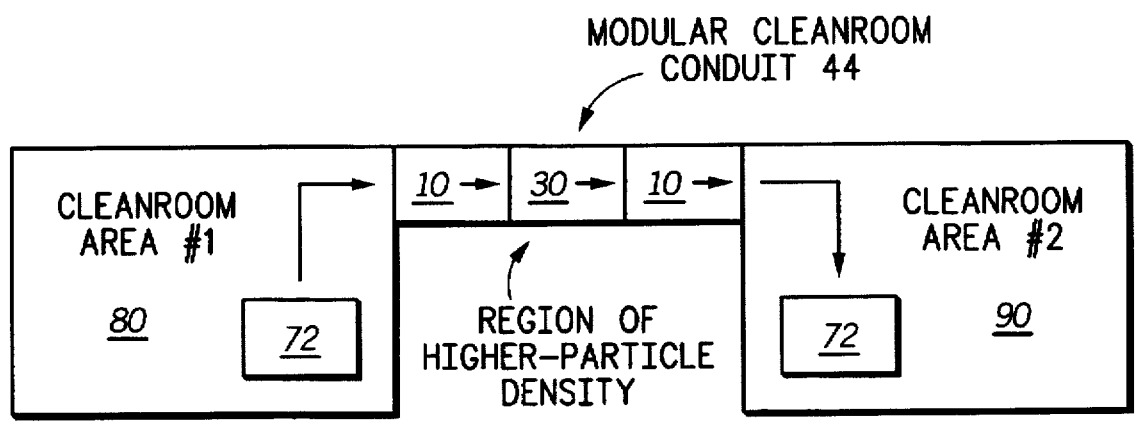
FIG. 8 illustrates, in a side view, how a modular cleanroom conduit is used to transport product, such as semiconductor wafers, from one cleanroom area to another in accordance with the present invention.

Thus in the situation where a first cleanroom is located in one area and a second cleanroom is located in another area and the region separating the two cleanrooms has a higher particle density than either cleanroom, use of the modular cleanroom conduit of the present invention allows products to be transported between the two cleanrooms without the need for a decontamination step. For example, in reference to FIG. 8, modular cleanroom conduit 44 is used to connect a first cleanroom area 80 to a second cleanroom area 90 through a region of higher particle density than either of the two cleanrooms. First, the product to be transported is placed into a carrier 72, such as a wafer boat, in the first cleanroom. The carrier is then placed inside the cleanroom conduit. For example, the carrier is placed onto the car assembly for the conveyance track (see e.g. FIG. 6). The carrier is then guided along the track to move from the first cleanroom to the second cleanroom. Once the carrier reaches the second cleanroom, it is then removed from the cleanroom conduit in the second cleanroom. The product can then be removed from the carrier without requiring a decontamination step since it had been maintained in a cleanroom environment during the transport.

The foregoing description and illustrations contained herein demonstrate many of the advantages associated with the present invention. In particular, it has been revealed that by providing a modular cleanroom conduit for transporting products between two cleanrooms, the need for decontamination equipment and associated personnel is eliminated. Moreover, the need for transport personnel is also eliminated. Additionally, the need for a "clean cart" for transporting product is eliminated. Yet another advantage is that the present invention can be built from existing materials using known technology. The conduit is modular in nature so that there is no length limit. Nor is there a limit on changes in elevation for the conduit since multiple vertical transfer stations can be built-in along the length of the conduit where necessary. Moreover, the modular cleanroom conduit is lightweight so that it can be hung from the ceiling without requiring any significant changes in the ceiling's structural support.

Thus it is apparent that there has been provided, in accordance with the invention, a modular cleanroom conduit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is possible to enclose the cleanroom conduit within a closed environment, such as an outer conduit having no perforated walls or the like, such that the gas supply is strictly recirculated within the closed environment. This variation is most likely to be used in cases where the supply gas is not ambient air. Additionally, a one-section version of the conduit with doors on both ends could be used as a "pass-through" in a cleanroom wall for transferal of products from the interior of a cleanroom to its exterior, or vice versa. Furthermore, the cleanroom conduit may be mounted at an angle (other than parallel to the ground) if the conveyance track will function at such angle. It may also be possible to provide for intersecting clean room conduits, such as T-shape, X-shape or Y-shape intersections, for transferring product to different cleanroom areas in a manufacturing facility. In addition, application of the invention is not limited to semiconductor products. Any other products that require cleanroom environments in its manufacturing could benefit from the present invention. Therefore, it is intended that this invention encompasses all such variations and modifications falling within the scope of the appended claims.

We claim:

1. A cleanroom conduit for transporting a product, which is sensitive to contaminants, between different cleanroom environments separated from each other by a region that has a higher particle density as compared to either cleanroom environments, comprising:

a plurality of modular sections including a first modular section which has a first outer wall, wherein the first outer wall has an opening, and has a second outer wall which is perforated and lies along a bottom of the first modular section; and means for supplying a gas into the first modular section through the opening in the first outer wall; and a conveyance track mounted inside the first modular section;

wherein the cleanroom conduit extends through the region to connect the two cleanroom environments, and wherein the plurality of modular sections includes a second modular section connected to the first modular section which has outer walls, including a perforated bottom outer wall, but which does not have the means for supplying a gas.

2. The cleanroom conduit of claim 1, further comprising: means for filtering located between the first modular section and the means for supplying the gas.

3. The cleanroom conduit of claim 2, wherein the means for filtering is selected from a group of filters consisting of a high efficiency particulate air filter and an ultra low particulate air filter.

4. The cleanroom conduit of claim 1 where the second modular section has a perforated outer wall which lies along a bottom of the second modular section.

5. The cleanroom conduit of claim 1 wherein the first modular section is a single chamber modular section.

6. The cleanroom conduit of claim 1, further comprising:
a third modular section as part of the plurality of modular sections, wherein the third modular section is connected to the second modular section and has a first outer wall having an opening like the opening in the first outer wall of the first modular section and has a second outer wall which is perforated and lies along a bottom of the third modular section; and
means for supplying a gas into the third modular section through the opening in the first outer wall of the third modular section.

7. A cleanroom conduit for transporting a semiconductor substrate between a first cleanroom environment separated from a second cleanroom environment by a region that has a higher particle density as compared to either cleanroom environments, wherein the cleanroom conduit extends through the region and comprises:
a first number of first modular sections, wherein each first modular section has:
a first outer wall, wherein the first outer wall has an opening; and
a filter attached to an exterior side of the first outer wall and over the opening;
a second number of second modular sections, wherein each second modular section has:
outer walls without a similar opening to the opening in the first outer wall of each first modular section, and wherein no filter is attached to the outer walls of the second modular section;
wherein the first modular sections and the second modular sections are connected to form the cleanroom conduit, wherein at least one first modular section is connected to a second modular section, and wherein conveyance track is mounted inside the first number of modular sections and the second number of modular sections for transporting said semiconductor substrate therethrough.

8. The cleanroom conduit of claim 7, wherein a ratio of the second number to the first number is no more than 4:1 in order to maintain an environment having less than 1 particle at 0.5 μm per 0.0283 m$^3$ within the cleanroom conduit.

9. The cleanroom conduit of claim 7, wherein each first modular section further comprises a fan and is configured such that the filter lies between the first outer wall and the fan.

10. The cleanroom conduit of claim 7, further comprising a vertical transfer station connecting a first section and a second section of the cleanroom conduit such that the first section is vertically offset from the second section.

11. The cleanroom conduit of claim 7 wherein the first modular sections and the second modular sections are each single chamber modular sections.

12. A process for transporting a product, which is sensitive to contaminants, between different cleanrooms separated from each other by a region that has a higher particle density as compared to either cleanrooms, comprising the steps of:
placing the product onto a carrier with a first cleanroom;
providing a cleanroom conduit that extends through the region and has a plurality of connected modular sections including a first modular section having a first outer wall, wherein the first outer wall has an opening for supplying gas therethrough, the first modular section also having a perforated second outer wall which is located at a bottom surface of the first modular section, and including a second modular section connected to the first modular section and which has outer walls but does not have an opening in any of its outer walls like the opening in the first outer wall of the first modular section;
inserting the carrier into the cleanroom conduit;
moving the product through the cleanroom conduit by guiding the carrier along a conveyance track placed inside the cleanroom conduit;
simultaneously with the step of moving, supplying a gas into the first modular section through the opening in the first outer wall, wherein at least a portion of the gas exits the first modular section through the perforated second outer wall;
simultaneously with the step of moving flowing a portion of the gas from the first modular section into the second modular section;
removing the carrier from the cleanroom conduit into a second cleanroom; and
removing the product from the carrier in the second cleanroom, wherein no decontamination of the product is required prior to removing it from the carrier.

13. The process of claim 12, wherein the step of supplying a gas supplies at least 10 changes per minute of air to the first modular section.

14. The process of claim 12, further comprising the step of filtering the gas before supplying the gas to the first modular section.

15. The process of claim 12 wherein the first modular section is a single chamber modular section.

16. A process for transporting a semiconductor substrate between a first cleanroom and a second cleanroom separated by a region that has a higher particle density as compared to either of the first and second cleanrooms, comprising the steps of:
placing the semiconductor substrate onto a carrier within the first cleanroom;
providing a cleanroom conduit that extends through the region and that has a first number of first modular sections and a second number of second modular sections connected to the first modular sections, wherein each first modular section has an opening in an outer wall thereof for supplying a filtered gas into each first modular section, wherein each second modular section does not have an opening in any of its outer walls like the opening in each first modular section for supplying the filtered gas therethrough, and wherein at least one of the first modular sections is connected to at least one of the second modular sections;
inserting the carrier into the cleanroom conduit;
moving the semiconductor substrate through the cleanroom conduit by guiding the carrier along a conveyance track placed inside the cleanroom conduit;
simultaneously with the step of moving, delivering the filtered gas into each first modular section and permitting the filtered gas to pass into any adjacent second modular section;
removing the carrier from the cleanroom conduit into the second cleanroom; and
removing the semiconductor substrate from the carrier in the second cleanroom wherein no decontamination of the semiconductor substrate is required prior to removing it from the carrier.

17. The process of claim 16, wherein the step of moving the semiconductor substrate utilizes a cleanroom conduit having a ratio of the second number to the first number of no more than 4:1 in order to maintain an environment having less than 1 particle at 0.5 μm per 0.0283 m$^3$ within the cleanroom conduit.

18. The process of claim 16, wherein the step of delivering the filtered gas uses a fan to pass air through a filter, wherein a combination of the fan and filter provides at least 10 changes per minute of filtered air to each first modular section.

19. The process of claim 16, further comprising the step of exhausting at least a portion of the gas through a perforated outer wall of each of the first and second modular sections.

20. The process of claim 16, wherein the step of delivering a filtered gas comprises using a filter selected from a group consisting of: a high efficiency particulate air filter, and an ultra low particulate air filter.

21. The process of claim 16 wherein the first modular sections and the second modular sections are each single chamber modular sections.

* * * * *